United States Patent [19]
Zimmerman et al.

[11] Patent Number: 5,625,631
[45] Date of Patent: Apr. 29, 1997

[54] PASS THROUGH MODE FOR MULTI-CHIP-MODULE DIE

[75] Inventors: Jeffrey S. Zimmerman; George W. Rohrbaugh, III, both of Chittenden County, Vt.

[73] Assignee: International Business Machines Corporation, Armonk, N.Y.

[21] Appl. No.: 638,414

[22] Filed: Apr. 26, 1996

[51] Int. Cl.⁶ ........................ G06F 11/00
[52] U.S. Cl. ........................ 371/22.1
[58] Field of Search .......... 324/73.1; 371/22.1, 371/22.2, 22.3, 22.5, 22.6, 28

[56] References Cited

U.S. PATENT DOCUMENTS

| | | |
|---|---|---|
| 4,267,463 | 5/1981 | Mayumi . |
| 4,812,678 | 3/1989 | Abe . |
| 4,814,639 | 3/1989 | Saito et al. . |
| 4,825,414 | 4/1989 | Kawata . |
| 5,132,571 | 7/1992 | McCollum et al. . |
| 5,138,257 | 8/1992 | Katsura . |
| 5,191,241 | 3/1993 | McCollum et al. . |
| 5,204,556 | 4/1993 | Shankar . |
| 5,223,792 | 6/1993 | El-Ayat et al. . |
| 5,231,312 | 7/1993 | Gongwer et al. . |
| 5,338,981 | 8/1994 | Kim et al. . |
| 5,365,165 | 11/1994 | El-Ayat et al. . |
| 5,379,308 | 1/1995 | Nhuyen et al. . |

OTHER PUBLICATIONS

Altmann, "Enhanced Observability of Daisy-Chained Chips on Multi-Chip Modules", Research Disclosure, Feb. 1991, No. 322.

*Primary Examiner*—Vincent P. Canney
*Attorney, Agent, or Firm*—Whitham, Curtis, Whitham & McGinn; Robert A. Walsh, Esq.

[57] ABSTRACT

A multi-chip-module (MCM) architecture allows direct access to a chip with minimum cost in space, yield, and signal delay. A first chip of the MCM is connected to a second chip via corresponding I/Os, but only the first chip has I/Os are directly accessible off the MCM. A coupling circuit, responsive to a control signal, which passes signals in the directly accessible I/Os of the first chip to the I/Os of the second chip.

11 Claims, 3 Drawing Sheets

PASS THROUGH MODE FOR MULTI-CHIP-MODULE DIE

BACKGROUND OF THE INVENTION

1. Field of the Invention

The present invention generally relates to multi-chip-modules (MCMs) in which two or more integrated circuit (IC) chips are wired to the module and, more particularly, to an MCM architecture which requires access to all chips on the MCM for purposes of burn-in, test and debug operations.

2. Background Description

Often, when two or more chips are wired to a multi-chip-module (MCM), direct access to one chip is blocked by another chip. This complicates burn-in, test and debug operations on the module. As but one example, consider an MCM containing a microprocessor chip and an in line level 2 (L2) cache chip, although it will be understood by those skilled in the art that the problem, and the solution according to the invention described below, is not limited to this combination. In this particular type of design, most of the MCM input/outputs (I/Os) are wired directly to the L2 cache only. There is no way to get direct access to the microprocessor. Without direct access to the microprocessor, the L2 cache must be used functionally to provide a means of getting data to and from the microprocessor. This limits the ability to burn-in, test, and debug all the chips on the MCM.

In the above example for the case of burning-in, the L2 cache and the microprocessor may require different types of burn-in stress due to differences in logic chip and memory chip fabrication processes. Also, on an MCM it is difficult to exercise the L2 cache and the microprocessor separately.

For the case of manufacturing testing, it is difficult to generate test patterns. A simulation model of both chips may be required, and this would be very time consuming and expensive. A boundary scan approach can be used to make the test easier, but this often adds a substantial amount of circuitry and functional signal delay.

For the case of MCM debugging, it is difficult to determine which of the chips is failing without direct access to both chips independently. Since most of the interface between the microprocessor and the L2 cache is bi-directional, it is not possible to use any conventional techniques of pin pass through using the L2 cache drivers and receivers without extensive directional control from the microprocessor. Because of the difficulties involved in MCM debugging, MCM rework may not be accurate and thus more expensive.

SUMMARY OF THE INVENTION

It is therefore an object of the present invention to provide an architecture to gain direct access to all chips with minimum cost in space, yield, and functional signal delay.

According to the invention, there is provided an MCM architecture in which a first chip is connected to a second chip via corresponding I/Os, but only the first chip has I/Os which are directly accessible off the MCM. The invention provides a coupling circuit, responsive to a control signal, which passes signals in the directly accessible I/Os of the first chip to the I/Os of the second chip.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
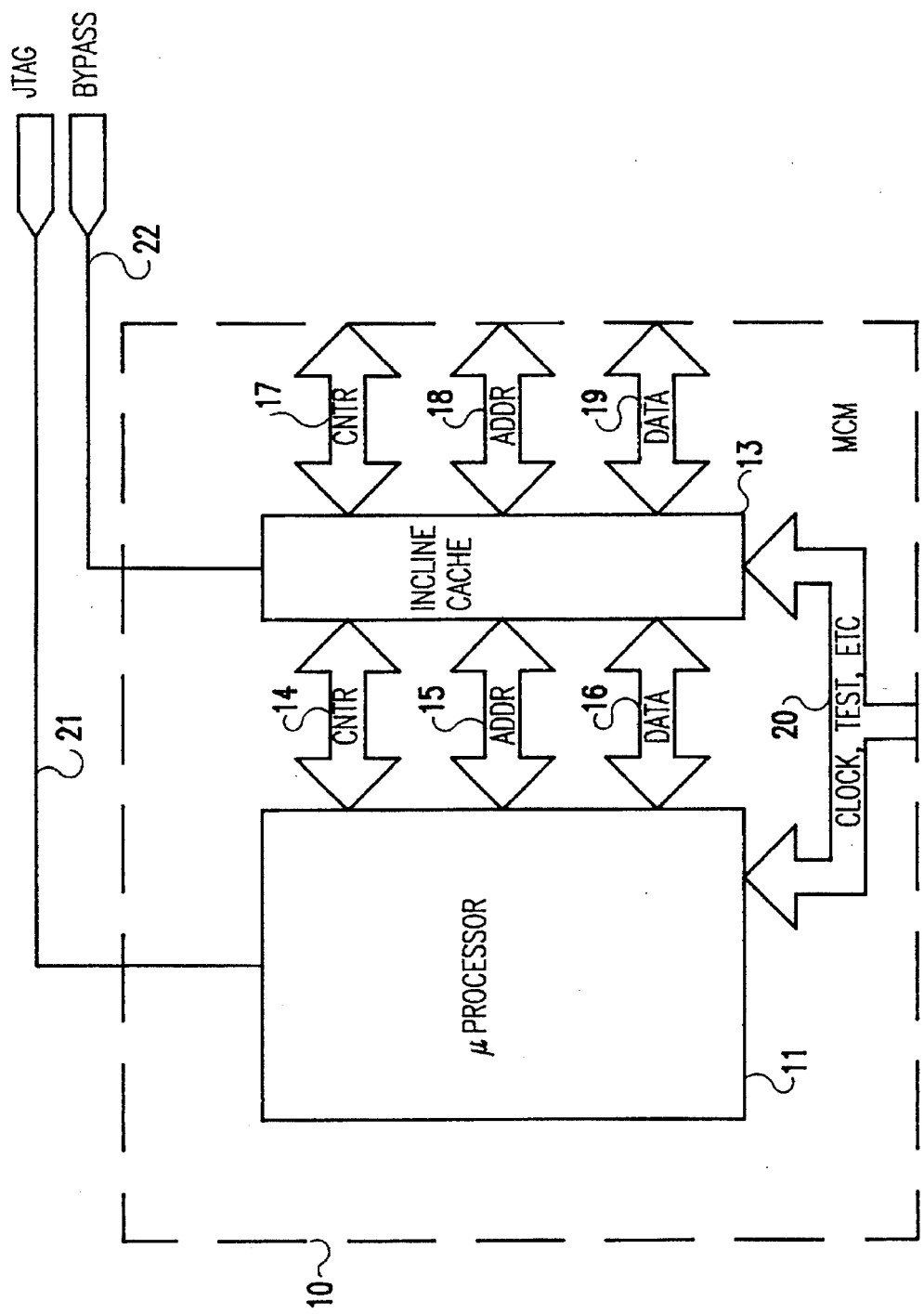
FIG. 1 is a functional block diagram of an MCM having an L2 cache and microprocessor.

Referring now to the drawings, and more particularly to FIG. 1, there is shown the overall layout of an MCM 10 for the example of a microprocessor 11 and L2 cache 13. Control, address and data from the L2 cache 13 memory subsystem bi-directionally traverse the L2 cache to the microprocessor over respective control, address and data buses 14, 15 and 16. Corresponding control, address and data buses 17, 18 and 19 communicate with the L2 cache I/Os and MCM connectors. These I/Os of the L2 cache 13 therefore effectively serve as the MCM subsystem I/Os since this is the only direct I/O access to the subsystem. Clock, test and other signals are provided directly to both the L2 cache 13 and the microprocessor 11 via bus 20. A JTAG (Joint Test Action Group of the IEEE) signal, for boundary scan functions, is provided to microprocessor 11 over line 21. This allows the MCM to remain JTAG compatible. A BYPASS signal to the L2 cache 13 on line 22 effectively connects the subsystem I/Os (i.e., the I/Os of the cache connected to buses 17, 18 and 19) to the processor I/Os (i.e., the I/Os connected to the buses 14, 15 and 16).

Figure 2:
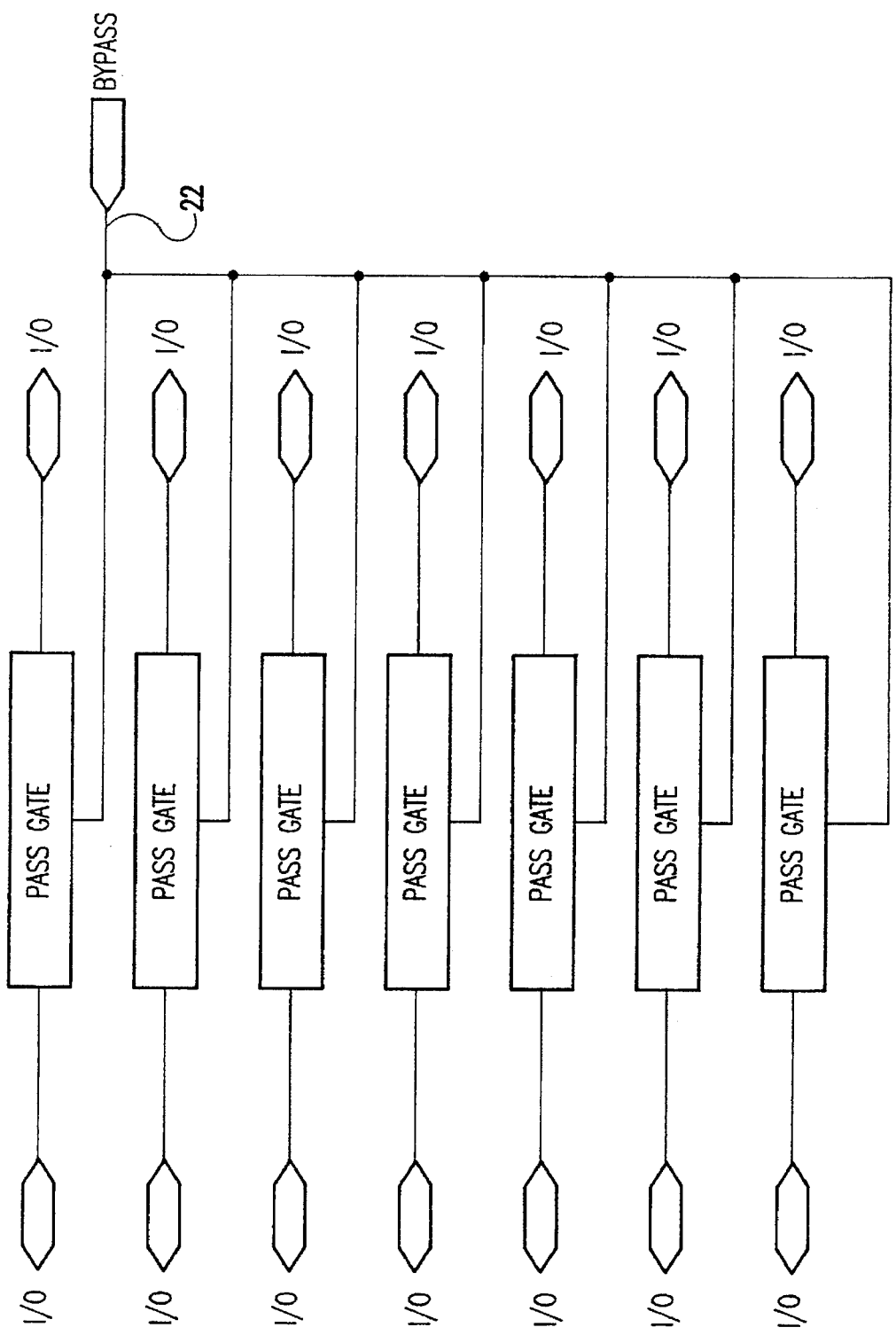
FIG. 2 is a block diagram of a portion of a pass gate array which is incorporated into the L2 cache of the MCM shown in FIG. 1.
Figure 3:
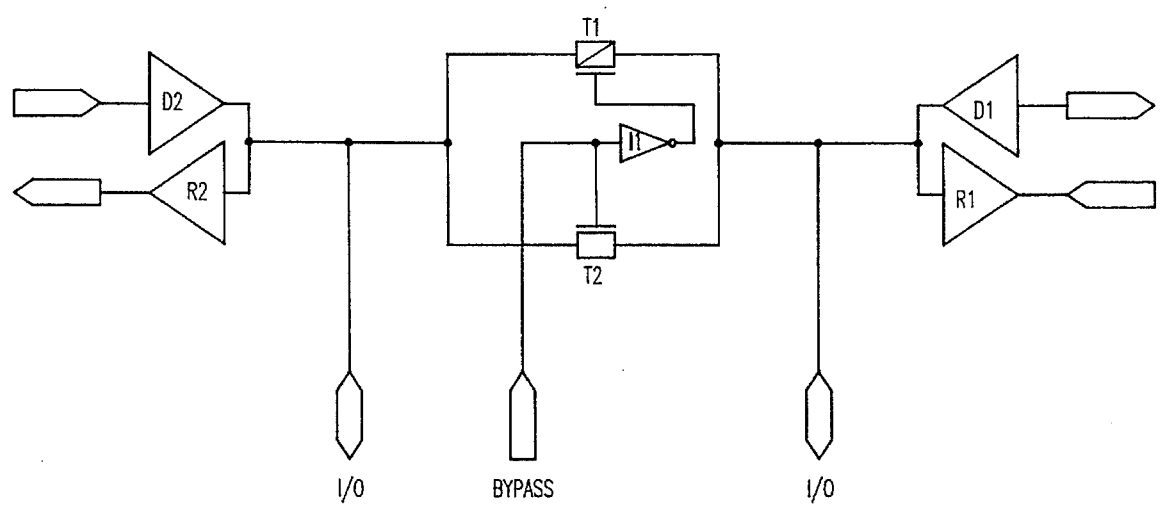
FIG. 3 is a schematic diagram of one of the pass gates of the pass gate array shown in FIG. 2 connected to a pair of bi-directional circuits.

FIG. 2 shows a portion of a pass gate array that receives the BYPASS signal on line 22. There is one pass gate for each pair of I/Os. FIG. 3 shows the details of the circuit construction of one of the pass gates in the array. Devices T1 and T2 are relatively large devices, device T1 in this example being a P-type field effect transistor (PFET) and device T2 being an N-type FET (NFET). Applying the BYPASS signal to T1 and T2 connects the two I/Os to each other. Inverter I1 generates the inverted signal needed for the PFET device T1. The pair of devices is required to eliminate any voltage drop through the pass gate circuit. Receiver R1 and driver D1 form the bi-directional circuit that would normally interface with the I/O subsystem. Receiver R2 and driver D2 form the bi-directional circuit that would normally interface with the processor I/Os.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A multi-chip-module architecture, comprising:

a first integrated circuit chip and a second integrated circuit chip mounted on a common carrier, said first integrated circuit chip having first and second input/output circuit means and said second integrated circuit chip having an input/output circuit means coupled to said second input/output means of said first integrated circuit chip; and circuit means for coupling said first and second input/output circuit means of said first integrated circuit chip to each other in response to a control signal.

2. The multi-chip-module architecture of claim 1 wherein said circuit means is incorporated into said first integrated circuit chip.

3. The multi-chip-module architecture of claim 2 wherein said circuit means comprises an array of pass gates connected between said first and second input/output circuit means and responsive to said control signal for providing a direct connection between said first and second input/output circuit means.

4. The multi-chip-module architecture of claim 3 wherein each pass gate of said array of pass gates comprises a P-type FET and an N-type FET connected in parallel between corresponding input/output terminals of said first and second input/output circuit means.

5. The multi-chip-module architecture of claim 4 wherein said P-type and N-type FETs are large devices to eliminate a voltage drop between said input-output terminals.

6. The multi-chip-module architecture of claim 1 wherein said first integrated circuit chip is a cache memory device and said second integrated circuit chip is a microprocessor device.

7. The multi-chip-module architecture of claim 6 wherein a separate line is provided directly to said microprocessor device over which a boundary scan signal can be supplied for test purposes.

8. The multi-chip-module architecture of claim 7 wherein said circuit means is incorporated into said cache memory device.

9. The multi-chip-module architecture of claim 8 wherein said circuit means comprises an array of pass gates connected between said first and second input/output circuit means and responsive to said control signal for providing a direct connection between said first and second input/output circuit means.

10. The multi-chip-module architecture of claim 9 wherein each pass gate of said array of pass gates comprises a P-type FET and an N-type FET connected in parallel between corresponding input/output terminals of said first and second input/output circuit means.

11. The multi-chip-module architecture of claim 10 wherein said P-type and N-type FETs are large devices to eliminate a voltage drop between said input-output terminals.

* * * * *